United States Patent
Chizuwa et al.

(10) Patent No.: US 10,790,685 B2
(45) Date of Patent: Sep. 29, 2020

(54) MEASUREMENT APPARATUS AND ON-BOARD BATTERY CHARGER

(71) Applicant: Panasonic Intellectual Property Management Co., Ltd., Osaka (JP)

(72) Inventors: Shuhei Chizuwa, Tokyo (JP); Naoyuki Tsuboi, Shizuoka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 381 days.

(21) Appl. No.: 15/887,669

(22) Filed: Feb. 2, 2018

(65) Prior Publication Data

US 2018/0233932 A1    Aug. 16, 2018

(30) Foreign Application Priority Data

Feb. 10, 2017  (JP) .................................. 2017-023286

(51) Int. Cl.
```
H02J 7/00       (2006.01)
G01R 31/40      (2020.01)
G01K 3/00       (2006.01)
G01R 31/28      (2006.01)
B60R 16/033     (2006.01)
G01R 19/165     (2006.01)
```
(52) U.S. Cl.
CPC ............ *H02J 7/0029* (2013.01); *G01K 3/005* (2013.01); *G01R 31/2829* (2013.01); *G01R 31/40* (2013.01); *H02J 7/00* (2013.01); *B60R 16/033* (2013.01); *G01R 19/16571* (2013.01); *G01R 19/16576* (2013.01)

(58) Field of Classification Search
CPC ....................................................... H02J 7/0029
USPC ......................................................... 320/162
See application file for complete search history.

(56) References Cited

U.S. PATENT DOCUMENTS 5,736,684 A * 4/1998 Fujitani ............... G01G 19/393
                                                  177/25.18
2016/0236637 A1* 8/2016 Krishna ............ B60R 21/01336

FOREIGN PATENT DOCUMENTS

JP   05-189687 A   7/1993
JP   2010-127633 A  6/2010

* cited by examiner

*Primary Examiner* — Edward Tso
*Assistant Examiner* — Ahmed H Omar
(74) *Attorney, Agent, or Firm* — Seed IP Law Group LLP

(57) ABSTRACT

A measurement apparatus includes first and second sensors, first and second processors, a multiplexer, and an A/D converter. The first and second sensors are configured to detect an identical physical quantity, and respectively output analog signals according to the physical quantity. The first processor performs an offset process on an analog signal from the first sensor using a first offset value to output a first analog signal. The second processor performs an offset process on an analog signal from the second sensor using a second offset value, which is different from the first offset value, to output a second analog signal. The A/D converter converts the first analog signal to output a first digital signal when the multiplexer outputs the first analog signal, and converts the second analog signal to output a second digital signal when the multiplexer outputs the second analog signal.

4 Claims, 6 Drawing Sheets

FIG. 4

| | Sensor (Upper: V1, Lower: V2) | Offset output (Upper: Va1, Lower: Va2) | MUX output | ADC output (Upper: Vd1, Lower: Vd2) | Corrected value (Upper: Vc1, Lower: Vc2) | Diagnostic result |
|---|---|---|---|---|---|---|
| Normal | 1mA / 1mA | 1 / 0.5 | 1 / 0.5 | 1 / 0.5 | 1 / 1 | Normal |
| Sensor fault MUX, ADC normal | 1mA / 0.5mA | 1 / 0.25 | 1 / 0.25 | 1 / 0.25 | 1 / 0.5 | Faulty |
| Sensor normal MUX fixed | 1mA / 1mA | 1 / 0.5 | 1 / 1 | 1 / 1 | 1 / 2 | Faulty |
| Sensor fault MUX fixed | 1mA / 0.5mA | 1 / 0.25 | 1 / 1 | 1 / 1 | 1 / 2 | Faulty |
| Sensor normal ADC fixed | 1mA / 1mA | 1 / 0.5 | 1 / 0.5 | 1 / 1 | 1 / 1 | Faulty |
| Sensor fault ADC fixed | 1mA / 0.5mA | 1 / 0.25 | 1 / 0.25 | 1 / 1 | 1 / 2 | Faulty |

FIG. 6

| | Sensor (Upper: V1, Lower: V2) | MUX output | ADC output (Upper: Vd1, Lower: Vd2) | Diagnostic result |
|---|---|---|---|---|
| Normal | 1mA | 1 | 1 | Normal |
| | 1mA | 1 | 1 | |
| Sensor fault MUX, ADC normal | 1mA | 0.5 | 1 | Faulty |
| | 0.5mA | | 0.5 | |
| Sensor normal MUX fixed | 1mA | 1 | 1 | Normal |
| | 1mA | | 1 | |
| Sensor fault MUX fixed | 1mA | 1 | 1 | Normal |
| | 0.5mA | | 1 | |
| Sensor normal ADC fixed | 1mA | 1 | 1 | Normal |
| | 1mA | | 1 | |
| Sensor fault ADC fixed | 1mA | 1 | 1 | Normal |
| | 0.5mA | 0.5 | 1 | |

MEASUREMENT APPARATUS AND ON-BOARD BATTERY CHARGER

BACKGROUND

1. Technical Field

The present disclosure relates to a measurement apparatus and an on-board battery charger that have a self-diagnostic function.

2. Description of the Related Art

Conventionally, gasoline engine-powered automobiles are required to incorporate a self-diagnostic function that meets the OBD2 (On-Board Diagnostics Second Generation) regulations, and fault diagnostics is carried out for a variety of sensors installed in the vehicles by a fault diagnostic device.

An example of the method of carrying out the fault diagnostics for sensors is as follows. In this method, one physical quantity (such as current, voltage, and temperature) is measured with two sensors (hereafter referred to as a "first sensor" and a "second sensor") and the measured values obtained by the respective sensors are compared (see FIGS. 5A and 5B). If the difference between the measured values by the two sensors is within an acceptable range, the sensors are considered to be normal. If the difference is out of the acceptable range, it is determined that there is a fault in the sensors.

In measurement apparatus 45A shown in FIG. 5A, A/D converters 54A and 54B are provided for sensors 51A and 51B, and analog signals from sensors 51A and 51B are converted into digital signals by A/D converters 54A and 54B, which respectively correspond to sensors 51A and 51B. Fault diagnostic unit 55A compares the digital signals that are output from A/D converters 54A and 54B with each other. In measurement apparatus 45B shown in FIG. 5B, analog signals from sensors 51A and 51B are selected (or switched) and output by multiplexer 53, and converted into a digital signal by one A/D converter 54. Fault diagnostic unit 55B compares digital signals that are output at different timings from A/D converter 54. Measurement apparatus 45B is smaller in size and lower in cost than measurement apparatus 45A because a portion of the two sensor systems uses common components.

SUMMARY

The present disclosure provides a measurement apparatus and an on-board battery charger that make it possible to reduce their cost and size, and also reliably carry out a fault diagnosis for the entire sensor circuit.

A measurement apparatus according to an aspect of the present disclosure includes first and second sensors, first and second processors, a multiplexer, and an A/D converter. The first and second sensors are configured to detect an identical physical quantity, and output respective analog signals according to the physical quantity. The first processor performs an offset process on the analog signal from the first sensor using a first offset value to output a first analog signal. The second processor performs an offset process on the analog signal from the second sensor using a second offset value, which is different from the first offset value, to output a second analog signal. The multiplexer selectively outputs the first analog signal and the second analog signal. The A/D converter converts the first analog signal into a first digital signal and outputs the first digital signal when the multiplexer outputs the first analog signal. The A/D converter converts the second analog signal into a second digital signal and outputs the second digital signal when the multiplexer outputs the second analog signal.

An on-board battery charger according to the aspect of the present disclosure includes a charging circuit and the above-described measurement apparatus. The first and second sensors in the measurement apparatus detect a physical quantity at an identical location in the charging circuit.

The present disclosure makes available a measurement apparatus and an on-board battery charger that make it possible to reduce cost and size, and also reliably carry out a fault diagnosis for the entire sensor circuit.

BRIEF DESCRIPTION OF DRAWINGS

FIG. 4 is a table illustrating an example of fault diagnostic results obtained by the measurement apparatus shown in FIG. 1.

FIG. 6 is a table illustrating an example of fault diagnostic results obtained by the measurement apparatus shown in FIG. 5B.

DETAILED DESCRIPTION OF PREFERRED EMBODIMENTS

Figure 5A:
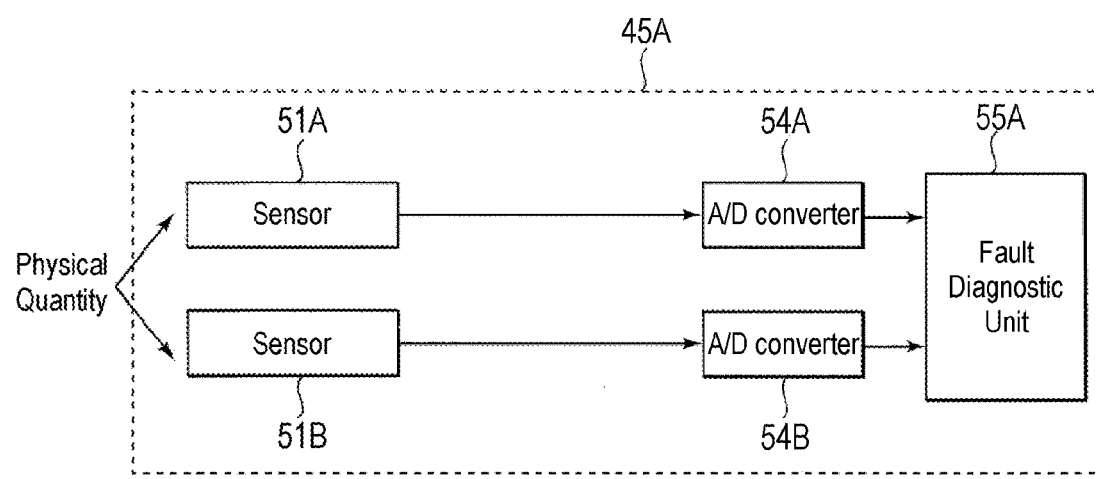
FIG. 5A is a diagram illustrating an example of conventional measurement apparatuses.
Figure 5B:
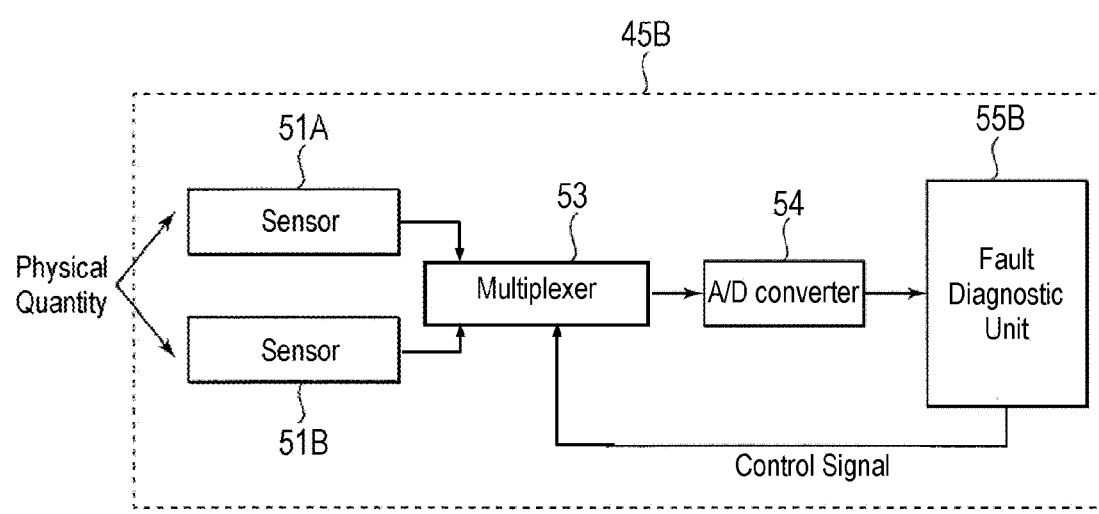
FIG. 5B is a diagram illustrating another example of the conventional measurement apparatuses.

Problems with a conventional apparatus will be described briefly prior to describing exemplary embodiments of the present disclosure. As illustrated in FIG. 5B, it is possible to reduce the cost and size of a measurement apparatus by utilizing a multiplexer. However, when a fault occurs in the multiplexer or the A/D converter, the measurement apparatus cannot diagnose a fault of the sensors. For example, when the multiplexer causes an output fixation, the multiplexer outputs only the analog signal that indicates a measured value by one of the sensors. As a consequence, even though a fault occurs in one of the sensors, the sensor is misdiagnosed as being normal (see FIG. 6). The term "output fixation" is intended to mean that the output is fixed to the analog signal to a specific input signal even when a control signal instructs the multiplexer to switch connection between input terminals.

Hereafter, exemplary embodiments of the present disclosure will be described in detail with reference to the drawings.

Figure 1:
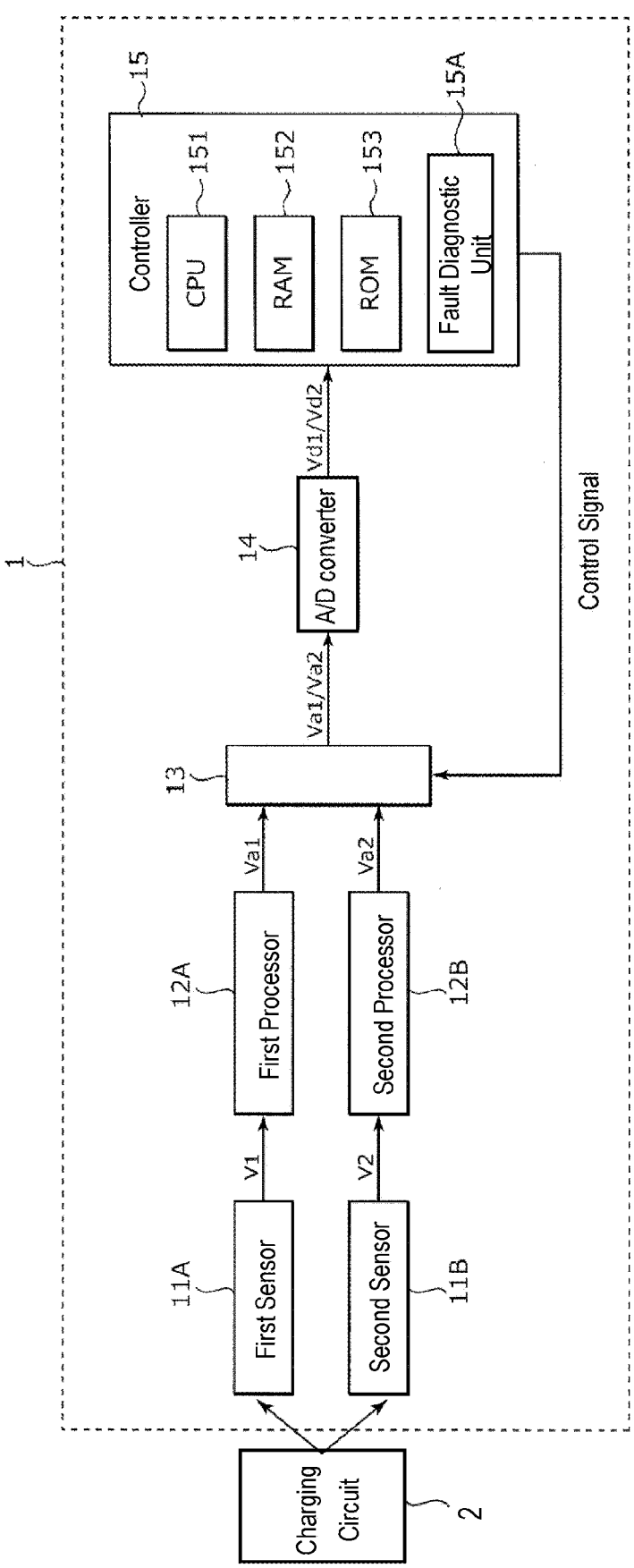
FIG. 1 is a diagram illustrating a measurement apparatus according to an exemplary embodiment of the present disclosure.

FIG. 1 is a diagram illustrating the configuration of measurement apparatus 1 according to an exemplary embodiment of the present disclosure, and an on-board battery charger including measurement apparatus 1. The on-board battery charger includes measurement apparatus 1 and charging circuit 2.

Measurement apparatus 1 is incorporated in the on-board battery charger as illustrated in FIG. 1, for example, and measurement apparatus 1 measures the current, the voltage, or the temperature of charging circuit 2 as a physical quantity to be measured. Measurement apparatus 1 has a self-diagnostic feature that meets OBD2 regulations.

Measurement apparatus 1 includes first sensor 11A, second sensor 11B, first processor 12A, second processor 12B, multiplexer 13, A/D converter 14, and controller 15.

First sensor 11A and second sensor 11B are sensors with the same specification, and output electric signals (analog signals) V1 and V2 according to a physical quantity. First sensor 11A and second sensor 11B detect an identical physical quantity. The present exemplary embodiment describes cases in which first sensor 11A and second sensor 11B detect a current flowing in charging circuit 2.

Each of first processor 12A and second processor 12B may include, for example, a resistor or an operational amplifier. First processor 12A and second processor 12B may be incorporated in sensor devices respectively with first sensor 11A and second sensor 11B. Alternatively, first processor 12A and second processor 12B may be constructed separately from first sensor 11A and second sensor 11B.

First processor 12A performs an offset process on analog signal V1 from first sensor 11A, using a first offset value, to output first analog signal Va1. Second processor 12B performs an offset process on analog signal V2 from second sensor 11B, using a second offset value, to output second analog signal Va2.

The first offset value and the second offset value are different from each other. Although the term "offset" is used herein for convenience, the term "offset value" is meant to also include a value that is not offset. The first offset value may be, for example, 100% (i.e., no offset). When analog signal V1 from first sensor 11A shows 1 mA, first analog signal Va1 also shows 1 mA. The second offset value may be, for example, 50%. When analog signal V2 from second sensor 11B shows 1 mA, second analog signal Va2 shows 0.5 mA.

Multiplexer 13 has respective input terminals for first analog signal Va1 and second analog signal Va2, and an output terminal to A/D converter 14. Multiplexer 13 selectively outputs first analog signal Va1 and second analog signal Va2. In other words, multiplexer 13 alternatively outputs first analog signal Va1 and second analog signal Va2. The input signal switching operation of multiplexer 13 is carried out by controller 15.

A/D converter 14 converts first analog signal Va1 or second analog signal Va2, which is output from multiplexer 13, into a digital signal and outputs the digital signal. Digital signal Vd1, which is output from A/D converter 14 when controller 15 instructs multiplexer 13 to connect with first sensor 11A, is referred to as "first digital signal Vd1". Digital signal Vd2, which is output from A/D converter 14 when controller 15 instructs multiplexer 13 to connect with second sensor 11B, is referred to as "second digital signal Vd2". Thus, A/D converter 14 converts first analog signal Va1 into first digital signal Vd1 and outputs first digital signal Vd1 when multiplexer 13 outputs first analog signal Va1. On the other hand, A/D converter 14 converts second analog signal Va2 into second digital signal Vd2 and outputs second digital signal Vd2 when multiplexer 13 outputs second analog signal Va2.

Controller 15 includes CPU (Central Processor) 151 serving as an arithmetic operation device/control device, ROM (Read Only Memory) 153 serving as a main memory storage device, and RAM (Random Access Memory) 152. ROM 153 stores a basic program referred to as BIOS (Basic Input/Output System) and fundamental setting data. CPU 151 reads out a program from ROM 153 according to the contents of the process and develops the program in RAM 152, and by executing the developed program, CPU 151 controls a switching operation of multiplexer 13 and also carries out a fault diagnosis of measurement apparatus 1. Note that, other than such combinations of general-purpose hardware and software, controller 15 may also be composed of a dedicated circuit.

First analog signal Va1 and second analog signal Va2, corresponding to physical quantities that are detected by first sensor 11A and second sensor 11B, respectively, are input to multiplexer 13 at all times. Multiplexer 13 is switched by a control signal from controller 15 so as to alternatively output first analog signal Va1 and second analog signal Va2 to A/D converter 14. Controller 15 compares first digital signal Vd1 and second digital signal Vd2, which are output from A/D converter 14, with each other to carry out fault diagnostics for measurement apparatus 1 (a process performed as fault diagnostic unit 15A).

Figure 2:
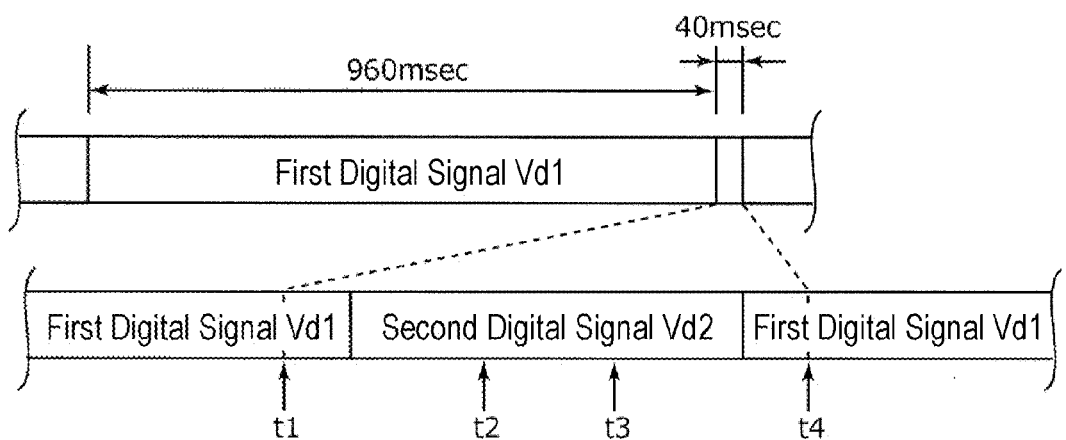
FIG. 2 is a view illustrating an example of an output signal from an A/D converter of the measurement apparatus shown in FIG. 1.

A fault diagnostic process by fault diagnostic unit 15A is carried out, for example, one time per second. Multiplexer 13 alternatively outputs first analog signal Va1 and second analog signal Va2 for a duration of, for example, 40 msec. Controller 15 reads first digital signal Vd1 at times t1 and t4 shown in FIG. 2 and reads second digital signal Vd2 at times t2 and t3, for example. The functions of fault diagnostic unit 15A will be detailed below with reference to the flowchart of FIG. 3.

Figure 3:
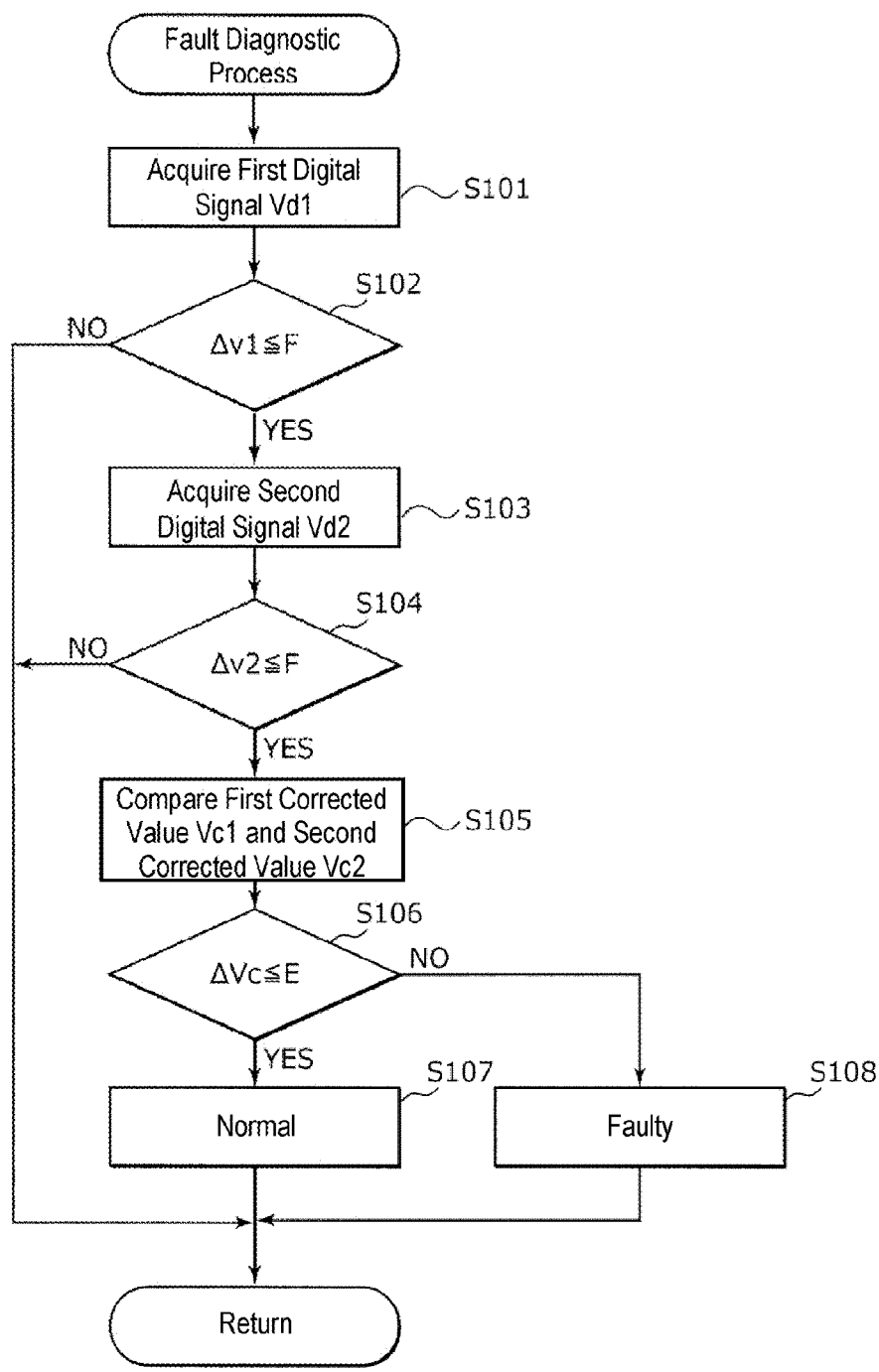
FIG. 3 is a flowchart illustrating an example of a fault diagnostic process in the measurement apparatus shown in FIG. 1.

FIG. 3 is a flowchart illustrating an example of fault diagnostic process executed by controller 15. This process is implemented, for example, by CPU 151 executing a fault diagnostic program stored in ROM 153 when the power to an on-board battery charger is turned on.

In step S101, controller 15 acquires first digital signals Vd1 that are read at times t1 and t4. This process is carried out after time t4 has passed.

In step S102, controller 15 determines whether or not variation amount Δv1 per unit time of first digital signal Vd1 acquired in step S101 (hereinafter referred to as "time-wise variation amount Δv1") is equal to or less than predetermined threshold value F. Threshold value F is a value that is used for the purpose of determining whether or not at least one of first digital signal Vd1 and second digital signal Vd2 is affected by external noise or the like. Threshold value F is greater than the amount of variation per unit time that can vary due to the accuracy of the sensors (for example, ±3%). If time-wise variation amount Δv1 is equal to or less than threshold value F (YES in step S102), the process moves to step S103. On the other hand, if time-wise variation amount Δv1 is greater than threshold value F (NO in step S102), the process ends.

In step S103, controller 15 acquires second digital signals Vd2 that are read at times t2 and t3.

In step S104, controller 15 determines whether or not variation amount Δv2 per unit time of second digital signal Vd2 acquired in step S103 (hereinafter referred to as "time-wise variation amount Δv2") is equal to or less than predetermined threshold value F. If time-wise variation amount Δv2 is equal to or less than threshold value F (YES in step S104), the process moves to step S105. On the other hand, if time-wise variation amount Δv2 is greater than threshold value F (NO in step S104), the process ends.

Thus, controller 15 does not output a valid fault diagnostic result if at least one of time-wise variation amount Δv1 of first digital signal Vd1 and time-wise variation amount Δv2 of second digital signal Vd2 is greater than threshold value F. This can prevent an erroneous fault diagnosis that is affected by an abrupt change in the physical quantity, such as external noise.

In step S105, controller 15 compares first digital signal Vd1 that is read at time t1 and second digital signal Vd2 that is read at time t2. Specifically, controller 15 compares first corrected value Vc1, which is obtained by correcting first digital signal Vd1 with the first offset value, and second corrected value Vc2, which is obtained by correcting second digital signal Vd2 with the second offset value, with each other. In the present exemplary embodiment, the first offset value is 100%, so first digital signal Vd1 remains to be first offset value Vc1. On the other hand, the second offset value is 50%, so a value of two times second digital signal Vd2 is second corrected value Vc2.

In step S106, controller 15 determines whether or not difference ΔVc between first corrected value Vc1 and second corrected value Vc2 is equal to or less than predetermined threshold value E. Threshold value E is a voltage corresponding to the sensor accuracy (for example, ±3%) of the first sensor 11A and the second sensor 11B. If difference ΔVc between the corrected values is equal to or less than threshold value E (YES in step S106), the process moves to step S107. On the other hand, if difference ΔVc between the corrected values is greater than threshold value E (NO in step S106), the process moves to step S108.

In step S107, controller 15 diagnoses the entire sensor circuit of measurement apparatus 1 as being functioning properly (normally). Controller 15 may further compare corrected values of first digital signal Vd1 that is read at time t1 and second digital signal Vd2 that is read at time t3, and if difference ΔVc between these corrected values is equal to or less than predetermined threshold value E, controller 15 may diagnose the entire sensor circuit as being normal.

In step S108, controller 15 makes a diagnosis that a fault is occurring in measurement apparatus 1. The fault in measurement apparatus 1 includes a fault in any one of first sensor 11A, second sensor 11B, multiplexer 13, and A/D converter 14. That is, when a fault occurs in any of the elements that constitute the sensor circuit of measurement apparatus 1, controller 15 can diagnose the fault appropriately.

The diagnostic results made by controller 15 are output to, for example, an ECU (Engine Control Unit) of a vehicle. When a fault occurs in measurement apparatus 1, a warning light is turned on, for example, to notify the driver that a fault is occurring in the on-board battery charger.

FIG. 4 is a table illustrating an example of fault diagnostic results obtained by measurement apparatus 1. FIG. 6 is a table illustrating an example of fault diagnostic results obtained by conventional measurement apparatus 45B (see FIG. 5B). FIGS. 4 and 6 show current values indicated by respective output signals when the actual current is 1 mA. In FIG. 4, the output values from multiplexer 13 when instructed to connect with first sensor 11A are shown in upper rows, whereas the output values from multiplexer 13 when instructed to connect with second sensor 11B are shown in lower rows. Likewise, in FIG. 6, the output values from multiplexer 53 when instructed to connect with sensor 51A are shown in upper rows, whereas the output values from multiplexer 53 when instructed to connect with sensor 51B are shown in lower rows. FIG. 4 shows the cases in which the first offset value is 100% and the second offset value is 50%.

The first set of rows in FIG. 4 shows the case in which all of first sensor 11A, second sensor 11B, multiplexer 13 (denoted as "MUX"), and A/D converter 14 (denoted as "ADC") are normal. In this case, both analog signals V1 and V2 from first sensor 11A and second sensor 11B indicate "1 mA". First analog signal Va1 from first processor 12A indicates "1 mA", and analog signal Va2 from second processor 12B indicates "0.5 mA". The output from multiplexer 13 when instructed to connect with first sensor 11A indicates "1 mA", and the output from multiplexer 13 when instructed to connect with second sensor 11B indicates "0.5 mA". First digital signal Vd1 from A/D converter 14 indicates "1 mA", and second digital signal Vd2 from A/D converter 14 indicates "0.5 mA". Both of first corrected value Vc1 and second corrected value Vc2 indicate "1 mA". Difference ΔVc between the corrected values is "0" (0<threshold value E), so the resultant diagnosis is "normal".

The second set of rows in FIG. 4 shows the case in which first sensor 11A, multiplexer 13, and A/D converter 14 are normal but second sensor 11B is faulty (½ the actual measurement value is detected). In this case, analog signal V1 from first sensor 11A indicates "1 mA", and analog signal V2 from second sensor 11B indicates "0.5 mA". First analog signal Va1 from first processor 12A indicates "1 mA", and second analog signal Va2 from second processor 12B indicates "0.25 mA". The output from multiplexer 13 when instructed to connect with first sensor 11A indicates "1 mA", and the output from multiplexer 13 when instructed to connect with second sensor 11B indicates "0.25 mA". First digital signal Vd1 from A/D converter 14 indicates "1 mA", and second digital signal Vd2 from A/D converter 14 indicates "0.25 mA". First corrected value Vc1 becomes "1 mA", but second corrected value Vc2 becomes "0.5 mA". Difference ΔVc between the corrected values is "0.5" (0.5>threshold value E), so the resultant diagnosis is "faulty".

The third set of rows in FIG. 4 shows a case in which first sensor 11A, second sensor 11B, and A/D converter 14 are normal, but multiplexer 13 is faulty and fixed to the input terminal from first sensor 11A. In this case, both analog signals V1 and V2 from first sensor 11A and second sensor 11B indicate "1 mA". First analog signal Va1 from first processor 12A indicates "1 mA", and second analog signal Va2 from second processor 12B indicates "0.5 mA". The output from multiplexer 13 indicates "1 mA" irrespective of the input terminal to be connected. First digital signal Vd1 from A/D converter 14 indicates "1 mA", and second digital signal Vd2 from A/D converter 14 also indicates "1 mA" (because second digital signal Vd2 is also an output obtained by converting first analog signal Va1). First corrected value Vc1 becomes "1 mA", but second corrected value Vc2 becomes "2 mA". Difference ΔVc between the corrected values is "1" (1>threshold value E), so the resultant diagnosis is "faulty".

The fourth set of rows in FIG. 4 shows the following case: first sensor 11A and A/D converter 14 are normal; second sensor 11B is faulty (½ the actual measurement value is detected); and multiplexer 13 is faulty and fixed to the input terminal from first sensor 11A. In this case, analog signal V1 from first sensor 11A indicates "1 mA", and analog signal V2 from second sensor 11B indicates "0.5 mA". First analog signal Va1 from first processor 12A indicates "1 mA", and second analog signal Va2 from second processor 12B indicates "0.25 mA". The output from multiplexer 13 indicates "1 mA" irrespective of the input terminal to be connected. First digital signal Vd1 from A/D converter 14 indicates "1 mA", and second digital signal Vd2 from A/D converter 14 also indicates "1 mA" (because second digital signal Vd2 is also an output obtained by converting first analog signal Va1). First corrected value Vc1 becomes "1 mA", but second corrected value Vc2 becomes "2 mA". Difference ΔVc between the corrected values is "1" (1>threshold value E), so the resultant diagnosis is "faulty".

The fifth set of rows in FIG. 4 shows the following case: first sensor 11A, second sensor 11B, and multiplexer 13 are normal; but A/D converter 14 is faulty and all the bits are fixed to indicate "1 mA". In this case, both analog signals V1 and V2 from first sensor 11A and second sensor 11B indicate "1 mA". First analog signal Va1 from first processor 12A indicates "1 mA", and second analog signal Va2 from second processor 12B indicates "0.5 mA". The output from multiplexer 13 when instructed to connect with first sensor 11A indicates "1 mA", and the output from multiplexer 13 when instructed to connect with second sensor 11B indicates "0.5 mA". Since all the bits are fixed to indicate 1 mA in A/D converter 14, first digital signal Vd1 from A/D converter 14 indicates "1 mA", and second digital signal Vd2 therefrom also indicates "1 mA". First corrected value Vc1 becomes "1 mA", but second corrected value Vc2 becomes "2 mA". Difference ΔVc between the corrected values is "1" (1>threshold value E), so the resultant diagnosis is "faulty".

The sixth set of rows in FIG. 4 shows the following case: first sensor 11A and multiplexer 13 are normal; second sensor 11B is faulty (½ the actual measurement value is detected); and A/D converter 14 is faulty and all the bits are fixed to indicate 1 mA. In this case, analog signal V1 from first sensor 11A indicates "1 mA", and analog signal V2 from second sensor 11B indicates "0.5 mA". First analog signal Va1 from first processor 12A indicates "1 mA", and second analog signal Va2 from second processor 12B indicates "0.25 mA". The output from multiplexer 13 when instructed to connect with first sensor 11A indicates "1 mA", and the output from multiplexer 13 when instructed to connect with second sensor 11B indicates "0.25 mA". First digital signal Vd1 from A/D converter 14 indicates "1 mA", and second digital signal Vd2 from A/D converter 14 also indicates "1 mA". First corrected value Vc1 becomes "1 mA", but second corrected value Vc2 becomes "2 mA". Difference ΔVc between the corrected values is "1" (1>threshold value E), so the resultant diagnosis is "faulty".

In FIG. 6 as well, multiplexer 53 is denoted as "MUX"), and A/D converter 54 is denoted as "ADC".

Measurement apparatus 45B misdiagnoses the sensors as being "normal" in the case as shown in the fourth set of rows in FIG. 6 when: first sensor 11A is normal; second sensor 11B is faulty (½ the actual measurement value is detected); and multiplexer 13 is faulty and is fixed to the input terminal from first sensor 11A.

Measurement apparatus 45B misdiagnoses the sensors as being "normal" in the case as shown in the sixth set of rows in FIG. 6 when: first sensor 11A is normal; second sensor 11B is faulty (½ the actual measurement value is detected); and A/D converter 14 is faulty and all the bits are fixed to indicate 1 mA.

On the other hand, in the cases as shown in the third and fifth sets of rows in FIG. 6, in which first sensor 11A and second sensor 11B are normal but either multiplexer 13 or A/D converter 14 is faulty, the diagnostic results indicating that the sensors are "normal" are correct, but this does not mean that an appropriate diagnosis (comparison) is made.

In contrast, measurement apparatus 1 is able to appropriately diagnose a fault even when the fault occurs in any of first sensor 11A, second sensor 11B, multiplexer 13, and A/D converter 14.

Thus, measurement apparatus 1 includes first sensor 11A, second sensor 11B, first processor 12A, second processor 12B, multiplexer 13, and A/D converter 14. First sensor 11A and second sensor 11B are configured to detect an identical physical quantity (such as current, voltage, or temperature) and respectively output analog signal V1 and V2 according to the physical quantity. First processor 12A performs an offset process on analog signal V1 from first sensor 11A, using a first offset value (for example, 100%), to output first analog signal Va1. Second processor 12B performs an offset process on analog signal V2 from second sensor 11B, using a second offset value (for example, 50%) different from the first offset value, to output second analog signal Va2. Multiplexer 13 selectively outputs first analog signal Va1 and second analog signal Va2. A/D converter 14 converts first analog signal Va1 into first digital signal Vd1 and outputs first digital signal Vd1 when multiplexer 13 outputs first analog signal Va1. A/D converter 14 converts second analog signal Va2 into second digital signal Vd2 and outputs second digital signal Vd2 when multiplexer 13 outputs second analog signal Va2.

In addition, measurement apparatus 1 may further include fault diagnostic unit 15A. Fault diagnostic unit 15A performs a fault diagnosis based on first digital signal Vd1, second digital signal Vd2, the first offset value, and the second offset value.

Measurement apparatus 1 makes it possible to reduce the cost and size of the apparatus by utilizing multiplexer 13 to allow part of the sensor system to use common components, and also makes it possible to reliably carry out fault diagnostics for the entire sensor circuit.

Although exemplary embodiments of the present disclosure have been described in detail hereinabove, the present disclosure is not limited to the foregoing exemplary embodiments, and various changes and modifications may be made without departing from the scope of the present disclosure.

For example, it is also possible to connect a plurality of sets of sensors that measure different physical quantities to one multiplexer 13. For example, a set of sensors measuring voltage, a set of sensors measuring current, and a set of sensors measuring temperature may be connected to one multiplexer 13. This serves to achieve further cost reduction and size reduction.

In addition, for example, the offsetting performed by first processor 12A and second processor 12B may be carried out by multiplication with offset values as described above, or it may be carried out by addition or subtraction with offset values.

It should be noted that the exemplary embodiments disclosed hereinabove are to be considered in all respects as illustrative and not restrictive. The scope of the present disclosure is not limited by the description set out above, limited to the foregoing description but is defined by the following claims, and the scope of the present disclosure is intended to include all modifications and equivalents within the scope of the following claims.

The measurement apparatus according to the present disclosure may suitably be applied to a measurement apparatus that is incorporated in a device that requires a self-diagnostic feature (for example, an on-board battery charger).

What is claimed is:

1. A measurement apparatus comprising:
   first and second sensors configured to detect an identical physical quantity, and output analog signals respectively according to the identical physical quantity;
   a first processor configured to perform an offset process on the analog signal from the first sensor using a first offset value to output a first analog signal;

a second processor configured to perform an offset process on the analog signal from the second sensor using a second offset value different from the first offset value to output a second analog signal;

a multiplexer configured to selectively output the first analog signal and the second analog signal;

an A/D converter configured to convert the first analog signal into a first digital signal and output the first digital signal when the multiplexer outputs the first analog signal, and convert the second analog signal into a second digital signal and output the second digital signal when the multiplexer outputs the second analog signal; and a fault diagnostic unit configured to perform a fault diagnosis based on the first digital signal, the second digital signal, the first offset value, and the second offset value, wherein the fault diagnosis includes comparing a first corrected value and a second corrected value with each other, the first corrected value being obtained by multiplying the first digital signal by an inverse of the first offset value, and the second corrected value being obtained by multiplying the second digital signal by an inverse of the second offset value.

2. The measurement apparatus according to claim 1, wherein the fault diagnostic unit does not output a valid fault diagnostic result in a case where a time-wise variation amount of at least one of the first digital signal or the second digital signal is greater than a predetermined threshold value.

3. The measurement apparatus according to claim 1, wherein the identical physical quantity is one of an identical current, an identical voltage, or an identical temperature.

4. An on-board battery charger comprising:
a charging circuit; and
a measurement apparatus, including:
first and second sensors configured to detect an identical physical quantity at an identical location in the charging circuit, and output analog signals respectively according to the identical physical quantity;

a first processor configured to perform an offset process on the analog signal from the first sensor using a first offset value to output a first analog signal;

a second processor configured to perform an offset process on the analog signal from the second sensor using a second offset value different from the first offset value to output a second analog signal;

a multiplexer configured to selectively output the first analog signal and the second analog signal;

an A/D converter configured to convert the first analog signal into a first digital signal and output the first digital signal when the multiplexer outputs the first analog signal, and convert the second analog signal into a second digital signal and output the second digital signal when the multiplexer outputs the second analog signal; and a fault diagnostic unit configured to perform a fault diagnosis based on the first digital signal, the second digital signal, the first offset value, and the second offset value, wherein the fault diagnosis includes comparing a first corrected value and a second corrected value with each other, the first corrected value being obtained by multiplying the first digital signal by an inverse of the first offset value, and the second corrected value being obtained by multiplying the second digital signal by an inverse of the second offset value.

* * * * *